(12) United States Patent
Xiu

(10) Patent No.: US 8,664,988 B1
(45) Date of Patent: Mar. 4, 2014

(54) CIRCUITS AND METHODS FOR CLOCK GENERATION USING A FLYING-ADDER DIVIDER INSIDE AND OPTIONALLY OUTSIDE A PHASE LOCKED LOOP

(71) Applicant: Liming Xiu, Plano, TX (US)

(72) Inventor: Liming Xiu, Plano, TX (US)

(73) Assignee: Kairos Microsystems Corporation, Plano, TX (US)

( * ) Notice: Subject to any disclaimer, the term of this patent is extended or adjusted under 35 U.S.C. 154(b) by 0 days.

(21) Appl. No.: 13/677,170

(22) Filed: Nov. 14, 2012

(51) Int. Cl.
*H03L 7/06* (2006.01)

(52) U.S. Cl.
USPC ............................ 327/156; 327/147

(58) Field of Classification Search
USPC .................................. 327/147, 156
See application file for complete search history.

(56) References Cited

U.S. PATENT DOCUMENTS

| | | | |
|---|---|---|---|
| 3,928,813 A | 12/1975 | Kingsford-Smith | |
| 6,329,850 B1 | 12/2001 | Mair et al. | |
| 6,940,937 B2 * | 9/2005 | Xiu et al. | 375/376 |
| 7,702,708 B2 * | 4/2010 | Xu et al. | 708/270 |
| 8,120,389 B2 * | 2/2012 | Xiu | 327/105 |
| 8,195,972 B2 * | 6/2012 | Renner et al. | 713/401 |
| 2004/0008805 A1 * | 1/2004 | Xiu et al. | 375/376 |
| 2007/0055718 A1 * | 3/2007 | Xu et al. | 708/270 |
| 2008/0021944 A1 * | 1/2008 | Xiu | 708/270 |
| 2009/0103604 A1 * | 4/2009 | Xiu et al. | 375/240.01 |
| 2009/0160493 A1 * | 6/2009 | You et al. | 327/105 |
| 2009/0161809 A1 * | 6/2009 | Xiu et al. | 375/376 |
| 2010/0091688 A1 * | 4/2010 | Staszewski et al. | 370/277 |
| 2011/0131439 A1 * | 6/2011 | Renner et al. | 713/401 |
| 2011/0285439 A1 * | 11/2011 | Xiu | 327/159 |
| 2012/0229171 A1 * | 9/2012 | Xiu et al. | 327/107 |
| 2012/0278645 A1 * | 11/2012 | Cornelius et al. | 713/400 |
| 2013/0027611 A1 * | 1/2013 | Closset | 348/537 |

OTHER PUBLICATIONS

Jan Craninckx and Michiel S. J. Steyaert; "A 1.75-GHz/3-V Dual-Modulus Divide-by-128/129 Prescaler in 0.7-um CMOS"; IEEE Journal of Solid-State Circuits; Jul. 1996; pp. 890-897; vol. 31, No. 7; Publisher Item Identifier S 0018-9200(96)04469-1.

Vasanth Kakani and Fa Foster Dai; "A 4.2-4.7GHz, 3.7mW Digitally Controlled Oscillator RFIC"; 2011; pp. 2841-2844; IEEE 978-1-4244-9474-3/11.

Kyeongho Lee, Joonbae Park, Jeong-Woo Lee, Seung-Wook Lee, Hyung Ki Huh, Deog-Kyoon Jeong and Wonchan Kim; "A Single-Chip 2.4-GHz Direct-Conversion CMOS Receiver for Wireless Local Loop Using Multiphase Reduced Frequency Conversion Technique"; IEEE Journal of Solid-State Circuits; May 2001; pp. 800-809; vol. 36, No. 5; Publisher Item Identifier S 0018-9200(01)03030-X.

(Continued)

*Primary Examiner* — Adam Houston
(74) *Attorney, Agent, or Firm* — Andrew D. Fortney

(57) ABSTRACT

A phase locked loop including a flying-adder divider circuit configured to receive phases of a periodic signal from a frequency generator and output a feedback signal to a phase detector, and a method of generating a periodic signal using such a flying-adder circuit, are disclosed. The flying-adder divider circuit generally includes a flying-adder and one or two divide-by-N dividers. The flying-adder receives K phases of the periodic signal, where K is an integer of at least 2, and generates a divided periodic signal from the K phases. The phase locked loop may include flying-adder divider circuits inside and/or outside the loop.

20 Claims, 13 Drawing Sheets

(56) References Cited

OTHER PUBLICATIONS

Chan-Hong Park, Ook Kim and Beomsup Kim; "A 1.8-GHz Self-Calibrated Phase-Locked Loop with Precise I/Q Matching"; IEEE Journal of Solid-State Circuits; May 2001; pp. 777-783; vol. 36, No. 5; Publisher Item Identifier S 0018-9200(01)03031-1.

Michael H. Perrott, Theodore L. Tewksbury and Charles G. Sodini; "A 27-mW CMOS Fractional-N Synthesizer Using Digital Compensation for 2.5-Mb/s GFSK Modulation"; IEEE Journal of Solid-State Circuits; Dec. 1997; pp. 2048-2060; vol. 32, No. 12; Publisher Item Identifier S 0018-9200(97)08270-X.

Liming Xiu; "A "Flying-Adder" On-Chp Frequency Generator for Complex SoC Environment"; IEEE Transactions on Circuits and Systems-II: Express Briefs; Dec. 2007; pp. 1067-1071; vol. 54, No. 12; Digital Object Identifier 10.1109/TCSII.2007.906943.

Jun Zhao and Yong-Bin Kim; "A 12-bit Digitally Controlled Oscillator with Low Power Consumption and Low Jitter"; 4 pages; Department of Electrical and Computer Engineering, Northwestern University, Boston, MA.

* cited by examiner

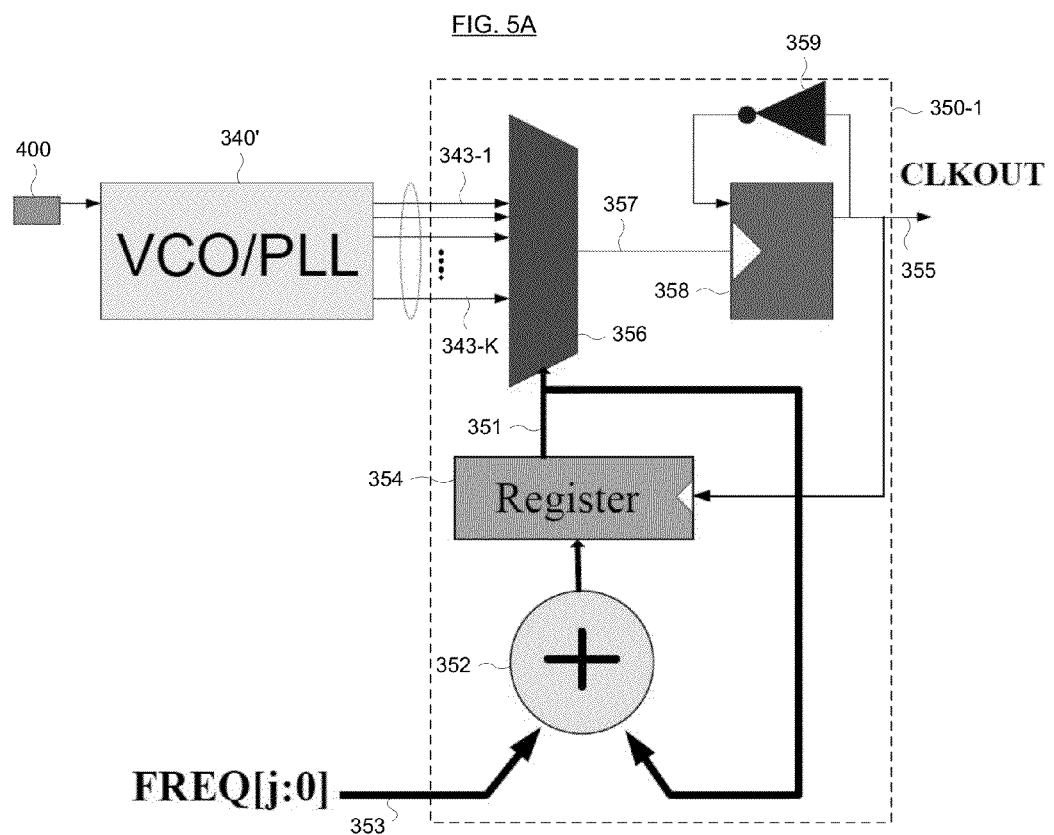

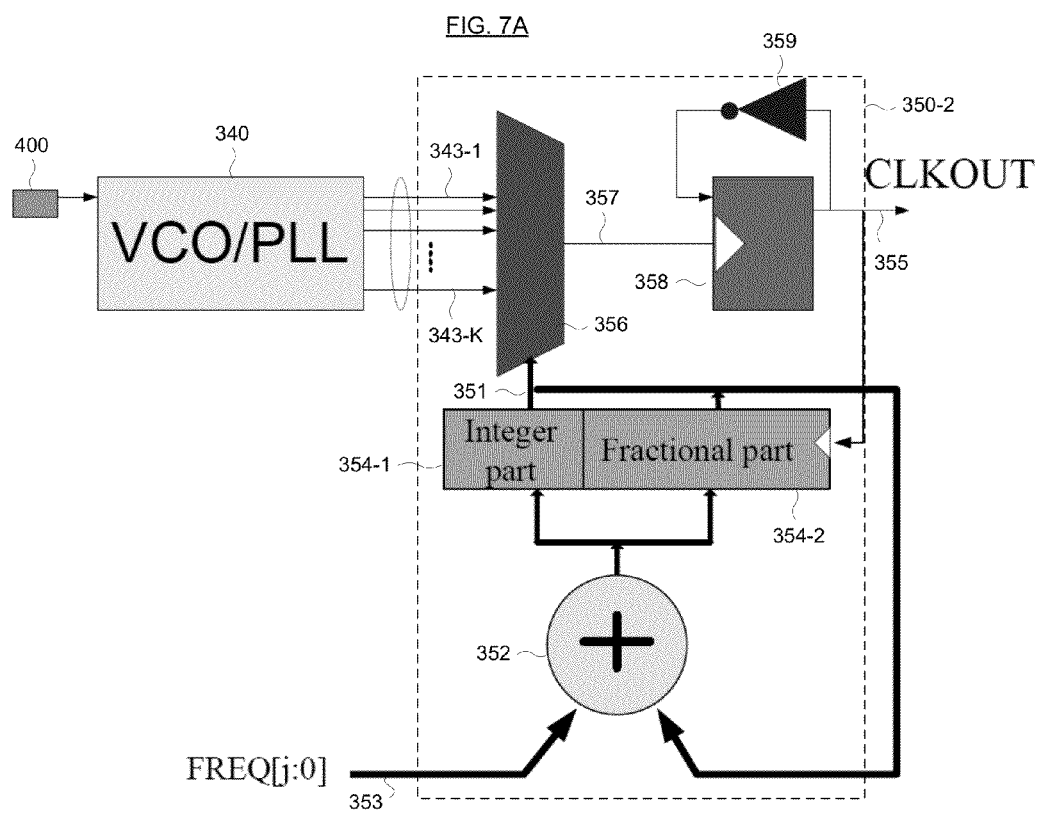

US 8,664,988 B1

CIRCUITS AND METHODS FOR CLOCK GENERATION USING A FLYING-ADDER DIVIDER INSIDE AND OPTIONALLY OUTSIDE A PHASE LOCKED LOOP

FIELD OF THE INVENTION

The present invention generally relates to the field of clock generation. More specifically, embodiments of the present invention pertain to circuitry and methods for clock generation using a flying-adder divider in a phase locked loop. The present circuitry and methods improve frequency resolution of an integer-N PLL without decreasing its bandwidth.

DISCUSSION OF THE BACKGROUND

Referring to FIG. 1, an integer-N phase locked loop (PLL) 100 typically is locked when the frequency ($f_b$) of its feedback signal 155 is equal to the frequency ($f_r$) of an incoming clock signal 105. Therefore, the frequency ($f_{vco}$) of the voltage controlled oscillator (VCO) 140 in the loop 100 equals $N*f_r$, where N is the divide-by ratio of a /N divider 150, the frequency resolution at the VCO 140 is $f_r$, and the bandwidth of the PLL loop is usually designed less than $f_r/10$. To improve frequency resolution, a relatively small frequency ($f_r$) of the incoming clock signal 105 is used. However, using a relatively small $f_r$ forces the loop bandwidth to be reduced. In PLL design, this phenomenon is known as "the resolution vs. bandwidth battle."

FIG. 1 shows a traditional implementation of an integer-N phase locked loop circuit 100 using a feedback mechanism. A phase detector 110 detects the frequency and phase difference between the input clock signal 105 and feedback signal 155, and outputs an offset signal 115 to a charge pump 120. The charge pump 120 converts the offset signal 115 into a current signal that can be fed to a low pass filter 130. Subsequently, the loop filter 130 smoothes this signal, and outputs an adjustment signal 135 to a voltage controlled oscillator (VCO) 140. The VCO 140 receives the signal 135 from the low pass filter 130 and outputs a clock signal 145 to a divide-by-N divider 150, where N is an integer and is constant. The divider 150 outputs a feedback signal 155 to the phase detector 110 for a frequency and phase comparison with the clock signal 105.

Generally, fractional-N phase locked loops, which have been known for several decades, are used most often to deal with the phenomenon and/or problem of a reduced loop bandwidth when using a relatively small $f_r$. Typically, there are several ways to achieve a fractional-N result.

Referring to FIG. 2, methods used to achieve fractional-N results included a dual modulus prescaler 160. In theory, with this method, there are virtually two dividers "N" and "A", and one dual modulus prescaler M/M+1, in the divider 160. As is known in the art of clock synthesis, the final output frequency ($f_{out}$) is related to the input frequency $f_r$ by the following equation:

$$f_{out}=f_r*(M*N+A) \quad (1)$$

In later years, multi-modulus dividers controlled by sigma-delta modulators outdated the dual modulus designs due to the capability of randomizing the fractional spurs and moving them to a higher frequency band. In both of the above approaches, there is a phase jump of one VCO period when the divide ratio of the divider 160 switches.

In recent years, multi-phase dividers have drawn attention from researchers since they can reduce the phase jump to less than one VCO period. Subsequently, a multi-phase divider was used in a fractional-N PLL (J. Craninckx, M. S. J. Steyaert, "A 1.75-GHz/3-V dual-modulus divide-by-128/129 prescaler in 0.7 µm CMOS," *IEEE J. Solid-State Circuits*, Vol. 31, No. 7, pp. 890-897, 1996). The dual modulus 4/5 prescaler is achieved through phase rotation within a 4-phase selection circuit. In another example, multi-phasing is used to produce a resolution of 1/8 VCO period. Furthermore, the 1/8 VCO period resolution was achieved with an additional capability of self-calibrating the mismatch between phases (see C. Park, O. Kim and B. Kim, "A 1.8 GHz self-calibrated phase-locked loop with precise I/Q matching," *IEEE J. Solid-State Circuits*, vol. 36, pp. 777-783, May 2001).

Presently, there are cases of combining multi-modulus and multi-phase techniques and using sigma-delta modulation on the multi-modulus divider (e.g., divider 160 in FIG. 2) to achieve low phase noise. Furthermore, there have been cases in which a glitch-free phase switching circuit is used as a 15/16 prescaler. The glitch-free phase switching circuit is achieved by only allowing phase rotation in a certain direction (e.g., backwards). Another example includes using a 1/8 fractional divider in a digital PLL.

In all of the above implementations, regardless of whether a multi-modulus or multi-phase divider 160 was used, the divide ratio is time-varying, and the output waveform of the divider 160 is not periodic. In other words, the divide ratio varies from time to time (e.g., is not constant), and the clock pulse is not a periodic signal. Thus, fractional spurs occur. Unfortunately, fractional spurs are a price that one pays for improved frequency resolution.

To obtain better frequency resolution ($f_r$), two integer-N PLLs may be cascaded together, as shown in FIG. 3. For the first PLL 200-1, the frequency ($f_{out1}$) at node 265 after the $M_1$ divider 260 can be expressed as $(N_1/M_1)*f_r$, where $N_1$ is the integer value of divider 250 and $M_1$ is the integer value of divider 260. This frequency $f_{out1}$ is used as the reference frequency of the second PLL 200-2. Thus, the output frequency $f_{out2}$ from the second PLL 200-2 can be expressed as $(N_2/M_2)*f_{out1}$, which is equal to $(N_1*N_2/(M_1*M_2))*f_r$, where $N_2$ is the integer value of divider 250' and $M_2$ is the integer value of divider 260'.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention relate to circuitry and methods for generating a periodic clock signal. The circuit (e.g., a phase locked loop) generally comprises (a) a phase detector configured to (i) receive an incoming clock and/or data signal and a feedback signal, and (ii) output a phase offset signal; (b) a control circuit configured to receive the phase offset signal and output a control signal; (c) a frequency generator configured to (i) receive the control signal and (ii) output a periodic signal having a first frequency; and (d) a flying-adder divider circuit configured to receive the periodic signal and output the feedback signal. The architectures and/or systems generally comprise those that include a phase locked loop circuit embodying one or more of the inventive concepts disclosed herein. The method of generating a periodic clock signal generally comprises (1) receiving a clock signal; (2) determining a phase offset between the clock signal and a feedback signal; (3) generating the periodic signal in response to a control signal that changes or maintains a frequency of the periodic signal based on or corresponding to the phase offset; and (4) generating said feedback signal by selecting transitions from among K phases of the periodic signal in response to or in accordance with a multibit frequency word, wherein K is an integer of at least 2.

The present invention advantageously improves resolution of a phase locked loop (PLL) without impacting the loop bandwidth and without generating fractional spurs at the output. The present invention advantageously solves the dilemma of using a smaller resolution ($f_r$) to provide a finer resolution, without creating a smaller loop bandwidth (e.g., $\sim f_r/10$).

Furthermore, the present invention advantageously uses a flying-adder frequency synthesizer as a fractional divider and positions the fractional divider inside the PLL loop. As a result, the present invention advantageously improves the performance, reliability, stability, and effectiveness of electronic systems that use the present invention.

These and other advantages of the present invention will become readily apparent from the detailed description of various embodiments below.

BRIEF DESCRIPTION OF THE DRAWINGS

FIG. 5A is a diagram showing a first exemplary flying-adder suitable for the present invention.

FIG. 7A is a diagram showing a second exemplary flying-adder suitable for the present invention.

DETAILED DESCRIPTION

Figure 1:
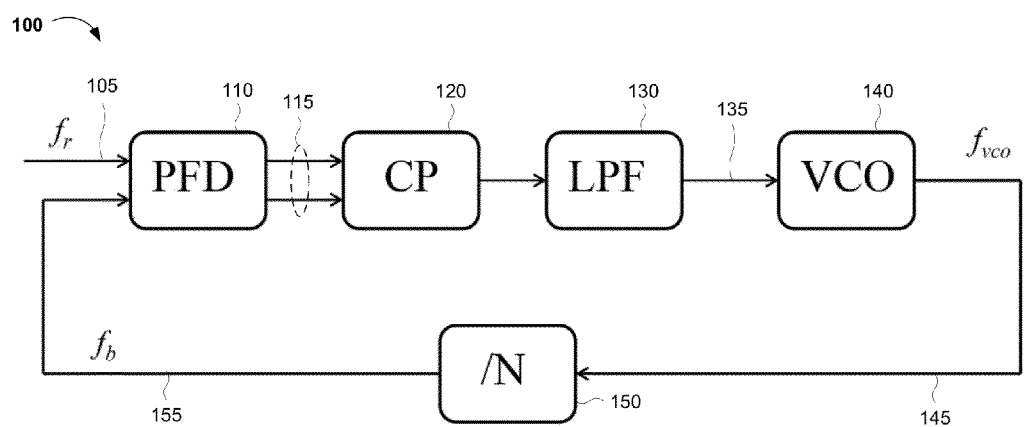
FIG. 1 is a diagram showing a generic integer-N phase locked loop.

Reference will now be made in detail to various embodiments of the invention, examples of which are illustrated in the accompanying drawings. While the invention will be described in conjunction with the following embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or signal processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, flip-flops, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (each of which may refer to direct or indirect connections, couplings, and communications), but these terms are also generally given their art-recognized meanings.

Exemplary Clock Generation Circuit

In one aspect, the present invention concerns a phase locked loop circuit that generally comprises (a) a phase detector configured to (i) receive an incoming clock signal and a feedback signal, and (ii) output a phase offset (e.g., in response to a phase and/or frequency difference between the clock signal and the feedback signal); (b) a control circuit configured to receive the phase offset signal and output a control signal; (c) a frequency generator configured to (i) receive the control signal and (ii) output a periodic signal having a first frequency (e.g., in response to and/or having a value controlled by the control signal); and (d) a flying-adder divider circuit configured to receive the periodic signal and output the feedback signal.

Figure 4:
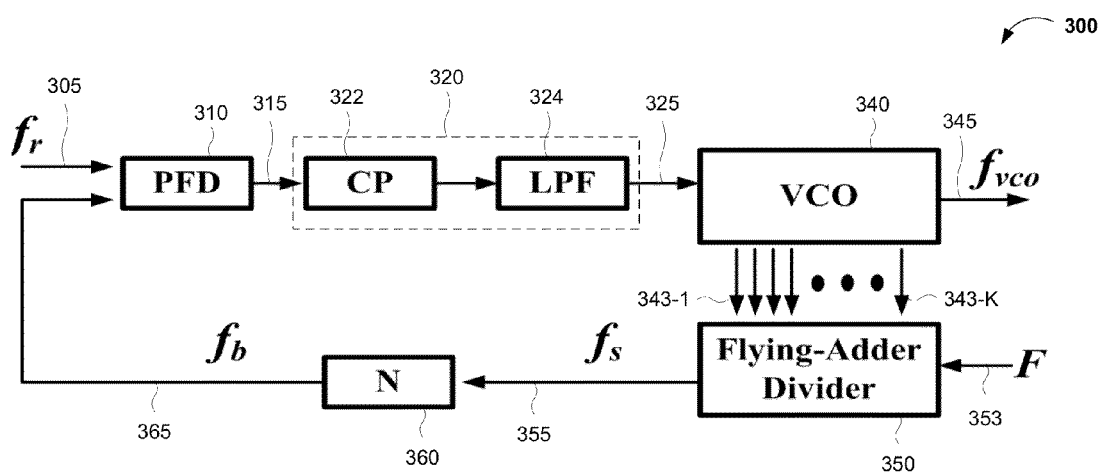
FIG. 4 is a diagram showing an exemplary phase locked loop using a flying-adder divider.

FIG. 4 is a diagram showing an exemplary phase locked loop 300 including a flying-adder divider 350. PLL 300 also includes a phase detector (e.g., a phase frequency detector) 310, a control circuit 320, a frequency generator (e.g., a VCO) 340, the flying-adder divider 350, and integer divider 360. Control circuit 320 may include a charge pump 322 and a filter (e.g., a low pass filter) 324.

The phase detector 310 detects the phase difference (and optionally the frequency difference) between a clock signal 305 and the feedback signal 365, and outputs a signal 315 corresponding to or indicative of the offset between the input signals to the charge pump 322. The charge pump 322 converts the offset signal 315 into a current (or analog offset) signal that can be fed to the filter (e.g., a low pass filter) 324. Subsequently, the filter 324 smoothes this signal, and outputs an adjustment or control signal 325 to a voltage controlled oscillator (VCO) 340. The VCO 340 receives the control signal 325 from the filter 324 and outputs a plurality of periodic signals 343-1 through 343-K. The flying-adder divider 350 receives the (periodic) signals 343-1 to 343-K from the VCO 340 and outputs a first divided signal 355 to a divide-by-N divider 360, where N is an integer. N may be constant or programmable. The /N divider 360 receives the first divided signal 355 and outputs a feedback signal 365 to the phase detector 310 for a phase (and optionally a frequency) comparison with the clock signal 305.

The transfer function of flying-adder divider 350 satisfies the following equation:

$$T_{out}=1/f_{out}=(F^*\Delta), \quad (2)$$

where $\Delta$ is the time difference between any two adjacent phases 343-1 through 343-K (e.g., the K-phase clock) that is input to the flying-adder 350. Thus, $\Delta$ satisfies the following equation:

$$\Delta=T_{vco}/K=1(K^*f_{vco}) \quad (3)$$

As a result, $f_{out}$ ($f_s$ in FIG. 4) satisfies the following equation:

$$f_{out}=(K/F)(f_{vco}), \quad (4)$$

where K is the number of phases received by the flying-adder divider 350 and F is a numerical value represented by a number of bits (or a bit string). Thus, the flying-adder 350 functions as a frequency divider.

When the PLL is in a locked state, the frequency of signal 365 ($f_b$) is equal to the frequency of signal 305 ($f_r$). Hence, the frequency of the voltage controlled oscillator (VCO) 340 satisfies the following equation:

$$f_{vco}=([F^*N]/K)(f_r) \quad (5)$$

In the above equations, the number of phases K, which is used to generate the base unit $\Delta$, is an integer of at least 2. Generally, K is constant after the design plan is fixed. As discussed above, F is a numerical value represented by a number of bits (or a bit string). F may be an integer or a real number (i.e., an integer plus a fraction). In addition, F is used to produce or set the desired output frequency. The frequency transfer function of the flying-adder 350-3 is $T_{out}=F^*\Delta$, or $1/f_{out}=F^*\Delta$, where each of $T_{out}$ and $1/f_{out}$ is the output period (i.e., inverse of the frequency). An example showing the flying-adder synthesizer 350-1 working principle follows.

Assume that the frequency generator 340' in FIG. 5A (e.g., a multi-phase VCO) can generate a base unit $\Delta$=50 ps, and an output frequency of 1 GHz (i.e., a period of 1 ns) from Flying-Adder synthesizer 350-1 is desired. For circuit 350-1 and 350-2, the frequency transfer function is $T_{out}=2^*F^*\Delta$. Then, $F=T_{out}/\Delta/2=1$ ns/50 ps/2=10. In circuit hardware, a five bit register (e.g., register 354 in FIG. 5A) can store this value (e.g., F<4:0>=10=01010b).

Figure 7B:
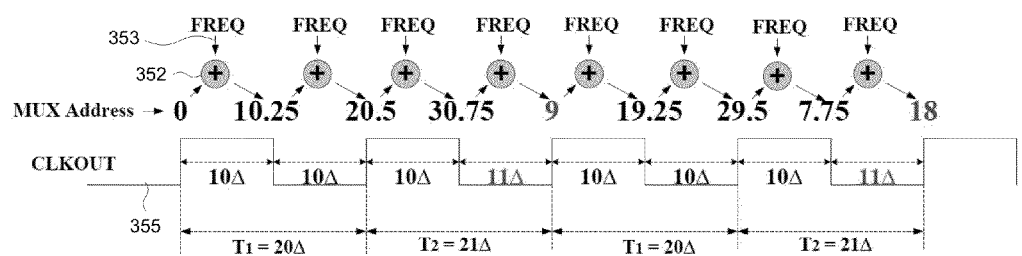
FIG. 7B is a diagram showing an exemplary operation of the flying-adder divider of FIG. 7A for producing a fractionally-divided output clock frequency.

Now referring to circuit 350-2 and FIG. 7B, assume that a different frequency of 975.6 MHz (i.e., a period of 1.025 ns) is desired. Then, $F=T_{out}/\Delta/2=1.025$ ns/50 ps/2=10.25. In this case, F contains a fraction. Some bits are needed to represent the fraction. For example, a 10-bit register (e.g., register 354-1, 354-2 in FIG. 7) can store a representative value F<9:0>, five bits for the integer and five bits for the fraction. Thus, F<9:0>=10.25=01010.01000b. From this example, we can also see that substantially any arbitrary frequency can be obtained as long as enough fraction bits are used to represent the fractional part of F.

K is used to help generate the base unit $\Delta$. In flying-adder technology, $\Delta$ is typically generated from a multi-phase VCO 340 which is locked to a reference clock signal (e.g., from crystal oscillator 400; see FIGS. 5A and 7A) through a PLL (e.g., an integer-N PLL). Assume that the VCO (e.g., 340) has K phases (e.g., K outputs 343-1 through 343-K) which are uniformly distributed over the VCO period $T_{vco}$. Thus, $\Delta=T_{vco}/K$. For example, a VCO that runs at 625 MHz ($T_{vco}$=1.6 ns) and has 32 phases has a $\Delta=T_{vco}/K=1.6$ ns/32=50 ps.

In an integer-N PLL such as PLL 100 in FIG. 1, the frequency $f_{vco}$ is equal to $N^*f_r$. Thus, for every N VCO cycles, the VCO output and the reference signal are compared once, and an error signal (e.g., 115) is produced. In integer-N PLL 100, the frequency resolution of $f_{vco}$ is $f_r$ (when N is adjusted to N+/−1). Thus, the time resolution is one period $T_{vco}$ of VCO 140 (the difference between N VCO cycles and N+/−1 VCO cycles). However, in the present invention, the comparison can be performed every (F/K)(N) VCO cycles. For any given N, the resolution is (N/K) ($T_{vco}$), where F can be adjusted in integer steps. In addition, the resolution is (F/K) ($T_{vco}$), where N can be adjusted in integer steps. Therefore, the present invention advantageously provides an opportunity to improve the time resolution to a value that is smaller than one $T_{vco}$.

In the term (F/K)*(N), K is a fixed value (i.e., K is fixed when the circuit design is fixed). Thus, two variables, F and N, can be adjusted. When F is adjusted, for example from F to F+1, then two results, F*(N/K) and (F+1)*(N/K), are the outcome. The time distance between them is N/K of the VCO cycle. Similarly, when N is adjusted, the time distance between adjacent N values is F/K of the VCO cycle.

Although the resolution is reduced when N is less than K, N is not necessarily less than K. When N is greater than K, the time resolution may be larger than $T_{vco}$. Incorporating a flying-adder divider in an integer-N PLL can improve or worsen the resolution, depending on the values of N, K and F. The combination of the flying-adder divider and use of post divider fractional bits recovery (PDFR; see the description below) ensures that the resolution is improved.

From the above discussion, the frequency resolution may improve (i.e., become less than $T_{vco}$) or become worse (i.e., become greater than $T_{vco}$). To assist with this phenomenon, the post divider fractional bits recovery (PDFR) technique may be implemented (see, e.g., L. Xiu, "A 'Flying-Adder' On-Chip Frequency Generator for Complex SoC," *IEEE*

*Trans. on Circuits and Systems II*, vol. 54, no. 12, pp. 1067-1071, December 2007, and L. Xiu, "Method and Apparatus for Reducing Jitter in Output Signals From a Frequency Synthesizer Using a Control Word Having a Fractional Bit," U.S. Pat. Appl. Publ. No. 2008/0021944, published Jan. 24, 2008).

When the flying-adder divider 350 is followed by a frequency divider 360, PDFR allows certain fractions to be used in F without causing timing irregularities in the divider 360 output. For example, if the fraction r in F is equal to 0.5, then F may be expressed as I+0.5, I being an integer. In such cases, there will be two types of cycles. The first cycle ($T_A$) is equal to (I)($\Delta$) and the second cycle ($T_B$) is equal to (I+1)($\Delta$). Each cycle alternates in the output 355 of the flying-adder 350 in a regular mode. As a result, the flying-adder output 355 waveform will appear as $T_A T_B T_A T_B T_A T_B T_A T_B$. In an average case, such as a time-averaged frequency, the frequency (or period) at the output 355 of the flying-adder 350 is ($T_A+T_B$)/2. If the divide-by-N divider 360 after the flying-adder circuit 350 divides by an even number such as 2, this irregularity is removed since the length of all the cycles becomes $T_{AB}$ (equal to (2I+1)($\Delta$) in the case of N=2) or a multiple thereof. In general, it can be proven that for a given divider ratio N, all the fractions 1/N, 2/N, . . . (N−1)/N can be used in F without the risk of time irregularities. In these cases, the output 365 from the divider 360 is a periodic signal from cycle to cycle having a frequency $f_b$. Thus, there is no timing jump of any size.

Thus, F is not limited to integers, but also may include fractions. For example, F can be expressed as I+i/N, where I is an integer of at least 2 and i is 1, . . . , N−1. As previously discussed, the frequency $f_{vco}$ at the output 345 of VCO 340 can be represented as shown in Equation (5) above, in which $f_{vco}$ is (I*N+i)($f_r$/K). Therefore, the resolution of VCO frequency $f_{vco}$ ($f_{vco}$) is $f_r$/K. This resolution is obtained when integer i is adjusted by one in either direction. Thus, utilizing PDFR improves the resolution from the previous case where PDFR is not used. For example, in the term (F/K)*N, as mentioned before, F can be adjusted (for example, from F to F+1, or from F to F−1) in integer steps to get the next adjacent or nearby frequency point.

In an integer-N PLL, such as PLL 100 in FIG. 1, the resolution is $f_r$. With the aid of the flying-adder divider 350 inside the loop 300 (FIG. 4), the resolution becomes (N/K)($f_r$) or (F/K)($f_r$). Depending on the particular N and F values, the resolution may be improved or may become worse. However, with the assistance of PDFR, the resolution is ensured to be $f_r$/K.

Because of PDFR, F can take integer values, and also can include many fractional values. Due to PDFR, for a given N value, all of the fractions 1/N, 2/N, 3/N . . . , (N−1)/N can be used without causing any timing irregularity in the output 365 of divide-by-N divider 360, and thus, in the output 345 of VCO 340 (for example, if N=16, then 1/16, 2/16, 3/16, . . . , 15/16 all can be used). Thus, in general, F can be expressed as F=I+i/N, where i=1, 2, 3, . . . , N−1. Example, if I=10 and N=16, all of the following F values can be used: 10+(1/16), 10+(2/16), 10+(3/16), . . . , 10+(15/16).

So, in one embodiment, two F values, $F_1$=I+i/N and $F_2$=I+(i+1)/N, can be chosen to obtain two adjacent (e.g., closest) frequency points, as shown in the following equations:

$$F_1 = I+i/N : (F/K)*N \to (I+i/N)*(N/K) \quad (6)$$

$$F_2 = I+(i+1)/N : (F/K)*N \to (I+(i+1)/N)*(N/K) = (I+i/N)*(N/K)+1/K \quad (7)$$

Thus, as can be seen, the time distance between these two cases is 1/K of the VCO cycle. Translating the time distance into frequency resolution, it is $f_r$/K.

The present invention advantageously improves the frequency resolution from $f_r$ to $f_r$/K, while maintaining the loop bandwidth at approximately $f_r$/10, because $f_r$ is unchanged in any hardwired circuit in which a flying-adder divider is added. Furthermore, post divider fractional bit recovery, a mathematical technique, has been implemented using a flying-adder divider with a register and logic configured to store and process fractional F bits (see, e.g., flying-adders 350-2 in FIGS. 7A and 350-3 in FIG. 8).

Figure 5B:
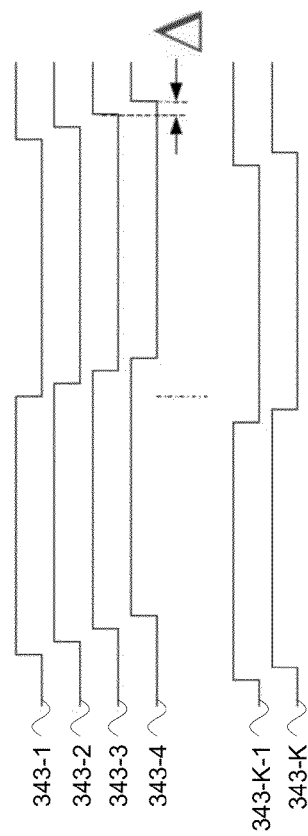
FIG. 5B is a diagram showing K equally-spaced clock phases output from the VCO/PLL in FIG. 5A.

FIG. 5A is a diagram showing the working principle of flying-adder divider circuit 350-1 suitable for the present invention. Here, VCO or PLL 340' receives a reference signal from a crystal oscillator 400 and outputs phases 343-1 through 343-K to a N-to-1 multiplexer 356. VCO/PLL output signals 343-1 through 343-K are generally equally-spaced clock phases, as shown in FIG. 5B. The multiplexer 356 outputs a selected signal 357 in response to an address provided by register 354, which in turn, loads an output of an accumulator or adder 352 on an edge of a clock signal CLKOUT (see the Q output 355 of D-type flip-flop 358). The output of D-type flip-flop 358 is also connected via inverter 359 to the data input of D-type flip-flop 358, which causes CLK1 to toggle in periodic fashion. D-type flip-flop 358 drives clock signal CLKOUT from its Q output.

Figure 5C:
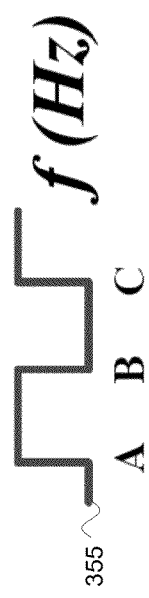
FIG. 5C is an exemplary waveform output by the flying-adder of FIG. 5A, having a periodic frequency.

The phase selection by the multiplexer 356 is effected by the accumulator 352, which adds the value of the frequency control word FREQ[j:0] (the same as or equivalent to frequency word F in FIG. 4), wherein j can be any integer of at least 1 (e.g., 1, 3, 4, 7, 9, 11, 15, 26, 31, etc.), with the value from register 354 (which may be from 2 [e.g., 4, 5, or more] to 32 bits wide). The frequency control word FREQ[j:0] may control the output frequency of the VCO/PLL 340' and may be provided by the user. Register 354 is the register receiving the sum generated by accumulator 352. The content of register 354 represents a multiplexer address 351, and be accumulated by accumulator 352 with FREQ[j:0]. The flying-adder 350-1 thus produces a clock signal 355 (see FIG. 5C) having a frequency f (in Hz) and transitions A, B, C, etc. that are relatively or substantially evenly-spaced.

Figure 6:
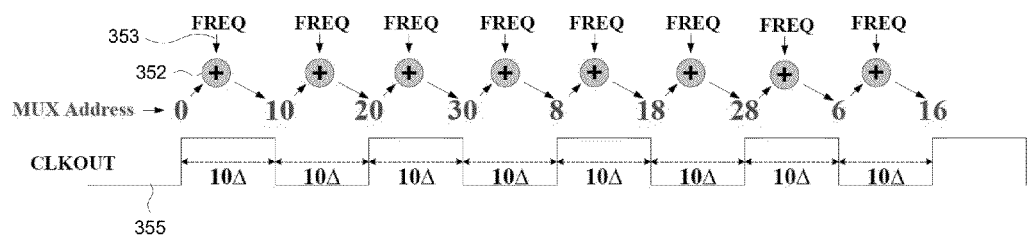
FIG. 6 is a diagram showing an exemplary operation of the flying-adder divider of FIG. 5A for producing a divided output clock frequency.

FIG. 6 is a diagram showing an exemplary operation of the flying-adder 350-1 of FIG. 5A with reference to its output transition spacing and/or frequency. For example, referring back to FIG. 5A, the VCO/PLL 340 has 32 outputs 343-1 through 343-K (K=32). The time difference between any two adjacent VCO outputs (e.g., 343-1 and 343-2) is $\Delta$. If the frequency control word FREQ[4:0] 353 is 10, which can be expressed as 01010b, then the frequency (i.e., the inverse of the period) of the output 355 of the flying-adder divider 350-1 is 20$\Delta$. In the example of FIG. 6, the register 354 (FIG. 5A) initially stores an address 0 of the multiplexer 356. When FREQ[4:0] 353 equals 10, this value is accumulated by accumulator 352 and loaded into the register 354. An address 10 is then selected as the output from the multiplexer 356, and the first transition following the initial transition occurs at 10$\Delta$ (see FIG. 6). The same frequency word FREQ[4:0] 353 is accumulated or added again by the accumulator or adder 352 on the next cycle of the output 355 of flying-adder 350-1, and the sum is loaded into the register 354 (FIG. 5A) at the next cycle of CLKOUT 355. The stored sum selects address 20 of the multiplexer 356, and the second transition of output 355 occurs at 10$\Delta$. Another clock or accumulation cycle of the flying-adder selects multiplexer address 30, then the next cycle selects multiplexer address 8 (i.e., 40−32). As can be seen, each flying-adder process cycle results in a time difference of 10$\Delta$ between transitions of the flying-adder output 355. If the VCO/PLL 340 of FIG. 5A is running at 625 MHz (i.e., a period of 1.6 ns), then $\Delta$ is (1.6/32) or 50 ps. Thus, the output 345 of PLL 340 (FIG. 4) has a period equal to 1 ns (e.g., a frequency of 1 GHz) when FREQ 353 (FIG. 5A) has a value of 10.

FIG. 7A is a diagram showing another exemplary flying-adder 350-2 having a register 354-2 configured to store fractional bits in the frequency word FREQ[j:0]. Here, VCO/PLL 340 receives a reference signal from crystal oscillator 400 and outputs equally-spaced phases 343-1 through 343-K (see, e.g., FIG. 5B) to K-to-1 multiplexer 356. The multiplexer 356 outputs a selected signal 357 in the same manner as in FIG. 5A. However, the register 354 now includes an integer part 354-1 and a fractional part 354-2.

The phase selection by the multiplexer 356 is effected by accumulator 352, which adds the value of the frequency control word FREQ[j:0], where j is an integer of at least 3, to the values from register 354-1, 354-2. The frequency control word FREQ[j:0] generally controls or determines the output frequency and may be provided by the user. The integer part 354-1 and the fractional part 354-2 of the register receive the sum generated by the accumulator 352. The most significant bits (e.g., the most significant portion) of the frequency word are applied from the integer part 354-1 to the multiplexer 356 as a multiplexer address 351. The output of register 354, including both the integer and fractional parts, is accumulated by accumulator 352 with the frequency word FREQ[j:0].

FIG. 7B is a diagram showing an exemplary operation of the flying-adder 350-2 of FIG. 7A with reference to the frequency at its output 355. If the frequency control word FREQ [9:0] at 353 is set to 10.25, which can be expressed in binary format as 01010.01000b, then the output's average frequency (e.g., the inverse of the period) is 20.5Δ. By using a fractional number for the frequency control word FREQ, two types of cycles, $T_1$ and $T_2$, are produced. Thus, a new frequency $(T_1+T_2)/2$ is produced.

In the example of FIG. 7B, the integer part 354-1 (FIG. 7A) initially stores an address 0 of the multiplexer 356. When the 5 most significant bits (e.g., FREQ[4:0]) equals 10, this value is loaded into the integer register 354-1, an address 10 is selected as the output from the multiplexer 356, and the first transition following the initial transition occurs at 10Δ (see FIG. 7B). The fractional portion (0.25) is stored in the fractional register 354-2. However, the entire contents of both the integer register 354-1 and the fractional register 354-2 are accumulated or added to the frequency word FREQ[9:0] by the accumulator or adder 352, and then the sum is loaded into the integer register 354-1 and the fractional register 354-2 (FIG. 7A) at the next cycle of CLKOUT 355. The integer part of the stored sum selects (via signal 351 of FIG. 7A) address 20 of the multiplexer 356, and the second transition of output 355 occurs at 10Δ (FIG. 7B). As a result, the period of the first output cycle of the flying-adder 350 is 20Δ. In the meantime, the fractional register stores a value 0.50. Another flying-adder processing cycle stores a value 30.75 in registers 354-1 and 354-2, and the integer register 354-1 selects multiplexer address 30. Thus, the third transition of output 355 occurs at 10Δ. Then, the next flying-adder processing cycle stores a value 41 in registers 354-1 and 354-2. The integer register 354-1 selects multiplexer address 9 (i.e., 41−32), the fractional register 354-2 stores a value of zero (0), and the fourth transition of output 355 occurs at 11Δ. Thus, the period of the second cycle of the flying-adder 350-2 is 21Δ (FIG. 7B). As can be seen, each flying-adder cycle results in a time difference of 10Δ at each of the second through fourth transitions of output 355 (FIG. 7B), and a time difference of 11Δ at the fifth transition of output 355. Therefore, the output 355 of the flying-adder 350-2 has an average period of 1.025 ns (e.g., an average frequency of 975.6 MHz), corresponding to the frequency word of 10.25.

Figure 8:
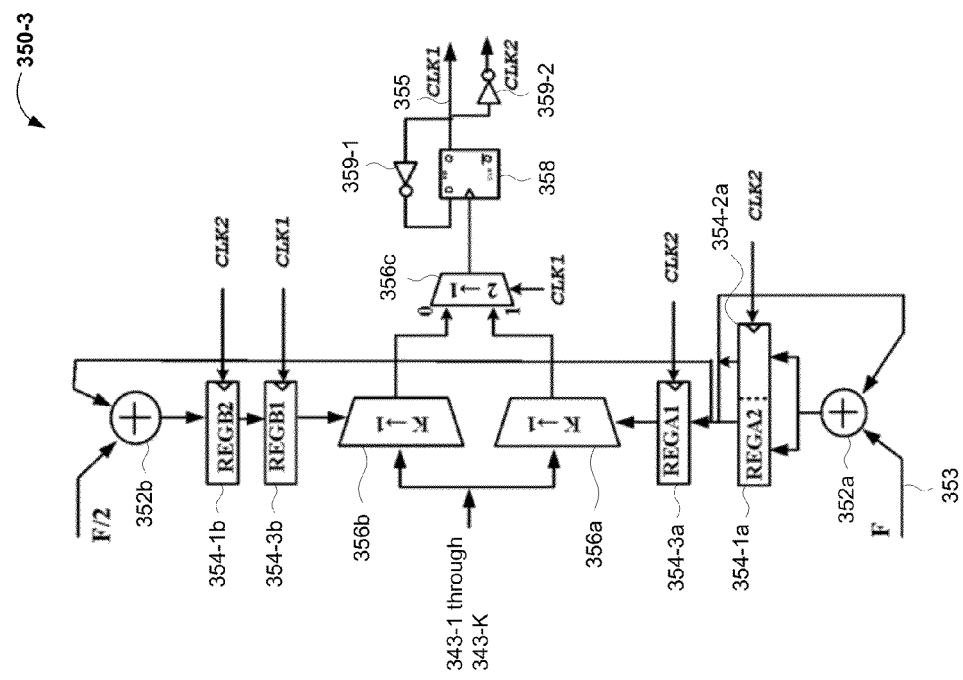
FIG. 8 is a diagram showing a third exemplary flying-adder suitable for the present invention.

FIG. 8 is a diagram showing a third exemplary flying-adder 350-3 suitable for clock generation or recovery in the present invention. The K inputs 343-1 through 343-K applied to the inputs of multiplexers 356a, 356b are a group of signals representing phases of the voltage controlled oscillator 340 (see FIGS. 4, 5A and 7A). The K inputs 343-1 through 343-K are essentially reference signals for the flying-adder divider 350-3. Multiplexers 356a and 356b are K-to-1 (in one embodiment 32-to-1) multiplexers for selecting one of the K phases according to the digital value applied by registers 354-3a and 354-3b, respectively. The outputs of multiplexers 356a and 356b are connected to two-to-one multiplexer 356c, which selects between the outputs of multiplexers 356a and 356b in response to clock signal CLK1 (see the Q output 355 of D-type flip-flop 358). The output of D-type flip-flop 358 is also connected via inverter 359-1 to the data input of D-type flip-flop 358, which causes CLK1 to toggle in periodic fashion. D-type flip-flop 358 delivers clock signal CLK1 355 from its Q output and clock signal CLK2 via inverter 359-2.

The phase selection by multiplexers 356a and 356b is effected by two adder legs. The first (lower) adder leg includes adder or accumulator 352a, which adds the value of the frequency control word FREQ (which in one embodiment may be 32 bits wide, and which may contain fractional bit values) with the value from registers 354-1a and 354-2a (which, when combined, may be 32 bits wide). The frequency control word FREQ generally determines or controls the output frequency, and may be provided by the user. Registers 354-1a (the integer register or part) and 354-2a (the fractional register or part) receive and store (e.g., on an edge such as the rising edge of the clock signal CLK2) the sum generated by adder 352a. The register 354-1a stores the integer part of the sum of FREQ and the output of registers 354-1a and 354-2a. Register 354-2a stores the fractional part 354-2 of this sum generated by the accumulator 352. The integer bits of register 354-1a are transferred to register 354-3a on an edge of CLK2 for subsequent or concurrent selection of a phase of the VCO/PLL 340'. The value stored in register 354-3a is applied to the select input(s) of multiplexer 356a.

The second (upper) adder leg of the flying adder circuit (e.g., flying-adder synthesizer 350-3 of FIG. 8) includes adder 352b, which receives a digital signal F/2 at one input, and the contents of register 354-1a at a second input. Signal F/2 is, in one implementation, the frequency word F divided by 2, to provide a 50% duty cycle at the output(s) of flying-adder 350-3. Adder 352b sums these two values, and stores the sum in register 354-1b on a (rising) edge of output clock signal CLK2. This value is clocked into register 354-3b on the next (rising) edge of output clock signal CLK1. The output of register 354-3b is then presented to the select input of multiplexer 356b.

Multiplexer 356c is controlled by output clock signal CLK1, so that the output of either multiplexer 356a or multiplexer 356b is forwarded to the clock input of flip-flop 358 in response to clock signal CLK1 having a first predetermined value (e.g., high or "1"), and the output of multiplexer 356b is forwarded in response to clock signal CLK1 having a second predetermined value (e.g., low or "0"). Clock signals CLK1, CLK2 are produced by flip-flop 358 as described above. Of course, it will be clear from the discussion herein that alternative and/or equivalent circuitry can provide the same or functionally similar results.

CLK1 is the output signal 355 of the flying-adder 350-3. Referring back to FIG. 4, CLK1 355 goes to the 1/N divider 360, whose output 365 goes to the phase detector 310. In general, any phase or phase-frequency detector can be used as phase detector 310.

Figure 9:
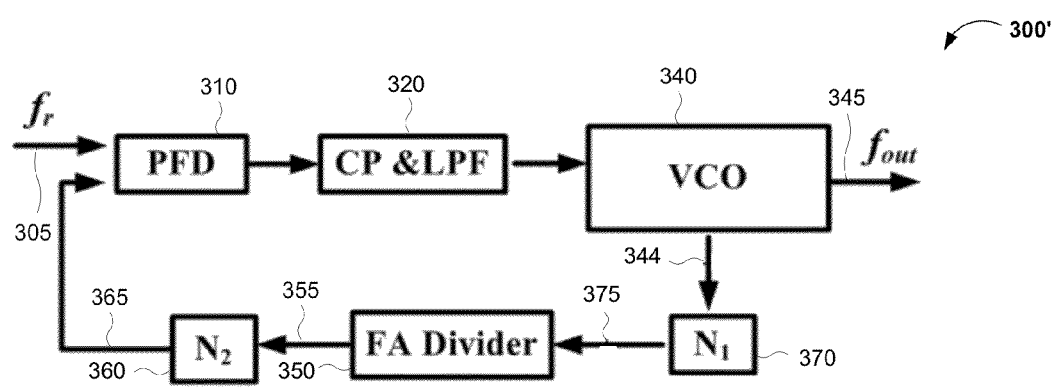
FIG. 9 is a diagram showing a second exemplary phase locked loop using a flying-adder divider and two integer dividers in the loop, suitable for use in the present invention.

Referring to FIG. 9, the location of the flying-adder divider 350 inside the PLL loop 300' may vary. PLL 300' also includes a phase detector (e.g., a phase and frequency detector) 310, a control circuit 320, a voltage controlled oscillator (VCO) 340, the flying-adder divider 350, a first integer divider 370, and a second integer divider 360. Control circuit 320 may include a charge pump and a filter. The phase detector 310 detects the phase and optionally the frequency of a clock or data signal 305. The VCO 340 outputs a plurality of periodic phase signals 344 to a first integer divider 370. The first integer divider 370 outputs a plurality of divided phase signals 375 to the flying-adder divider 350. The flying-adder divider 350 receives the divided phase signals 375 from the first divider 370 and outputs a signal 355 to a second integer divider 360 as described above. The second divider 360 receives the signal 355 and outputs a feedback signal 365 to the phase detector 310 for comparison with the clock and/or data signal 305. The PLL 300' and the PLL 300 (FIG. 4) may achieve similar results when $N=N_1*N_2$, but PLL 300' (FIG. 9) may provide further flexibility in implementing the flying-adder divider circuitry (which may comprise the flying-adder 350-3, and one or both of the first integer divider 360 and second integer divider 370).

Figure 10:
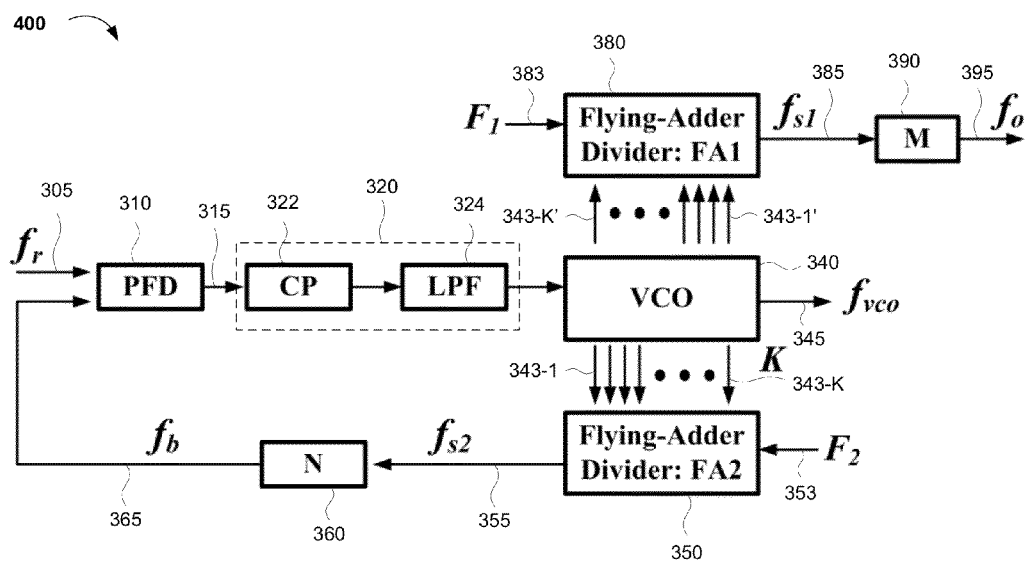
FIG. 10 is a diagram showing a third exemplary phase locked loop having a second flying-adder divider, suitable for use in the present invention.

Referring to FIG. 10, a third exemplary phase locked loop 400 includes a second flying-adder divider 380. Thus, in further embodiments, flying-adder dividers (e.g., 350 and 380) may be used both inside and outside the phase locked loop 400. In terms of frequency generation capability, the flying-adder PLL 400 is equivalent to two PLLs that are cascaded together (see, e.g., FIG. 3). However, the PLL 400 includes only 1 VCO and 1 PLL, and is therefore significantly easier to design, implement, and/or manufacture.

As previously discussed with regard to FIG. 4, the frequency $f_{vco}$ of the VCO 340 is $(F_2*N/K)*f_r$ where $F_2$ is a numeric value represented by a number of bits (or a bit string), and N is an integer divider ratio of the N divider 360. Thus, $T_{vco}=1/f_{vco}=K/(F_2*N*f_r)$ and $\Delta=T_{vco}/K=1/(F_2*N*f_r)$. From the flying-adder transfer function, $T_{s1}=1/f_{s1}=F_1*\Delta=F_1/(F_2*N*f_r)$. Thus, $f_{s1}=(F_2*N*f_r)/F_1$. The output of divide-by-M divider 390 has a frequency of $((F_2*N)/(F_1*M))*f_r$. This is mathematically similar to $f_{out2}=((N_1*N_2)/(M_1*M_2))*f_r$. In the example of FIG. 10, the VCO 340 outputs phases 343-1' through 343-K' to the second flying-adder divider 380. Phases 343-1' through 343-K' are generally the same as phases 343-1 through 343-K applied to the first flying-adder 350. The second flying-adder 380 may also receive a second frequency word 383. Second flying-adder 380 outputs signal 385 to a divide-by-M divider 390 configured to divide the signal 385 by a value M, where M is an integer. Divider 390 outputs another clock signal 395. Thus, the first divided signal 355 has a frequency that equals $K/F_2$ multiplied by the frequency of the first signal 345, wherein $F_1$ is a value of multi-bit frequency word received by the first flying-adder divider circuit 350, and the second divided signal 385 has a frequency that equals $K/F_1$ multiplied by the frequency of the signal 345, wherein $F_2$ is a value of multi-bit frequency word received by the second flying-adder divider circuit 380.

Figure 3:
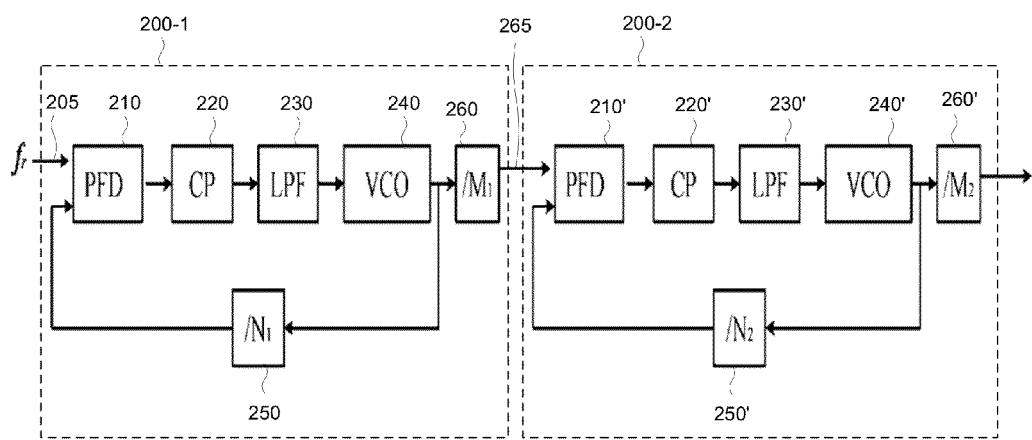
FIG. 3 is a diagram showing two integer-N phase locked loops cascaded together.

In other words, in terms of capability to generate clock signals of various frequencies, the structures of FIGS. 3 and 10 are similar. However, and more importantly, the flying-adder based PLL 400 is more powerful. PDFR allows certain fractions to be used in frequency words $F_1$ and $F_2$ at 383 and 353, respectively. In the integer-N PLL (see, e.g., FIG. 3), only integers can be used in the divider ratios N and M. Thus, the flying-adder assisted integer-N PLL 400 can generate many more frequencies (e.g., the resolution is finer than the cascaded PLL's of FIG. 3).

Figure 2:
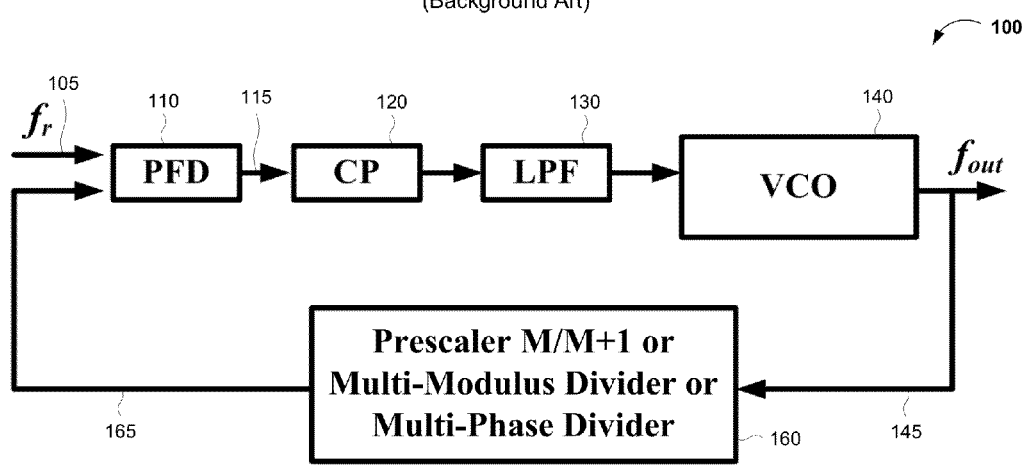
FIG. 2 is a diagram showing variations of a generic fractional-N phase locked loop.
Figure 11:
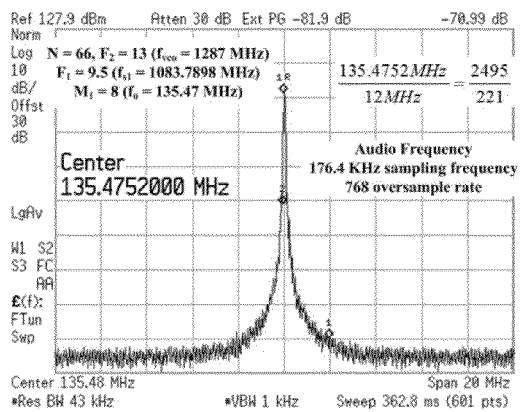
FIGS. 11 and 12 are graphs showing output frequency data using the exemplary phase locked loop of FIG. 10.
Figure 12:
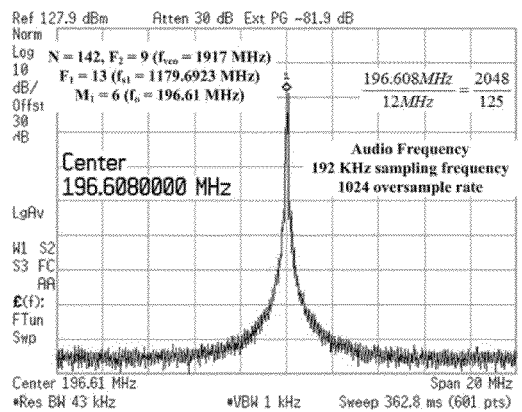

Referring to FIGS. 11-12, when the reference frequency $f_r$ is 12 MHz, using the flying-adder assisted PLL 400 of FIG. 10 to generate audio frequencies of 135.4752 MHz (FIG. 11) and 196.608 MHz (FIG. 12) results in no fractional spurs at the output 345 of the VCO 340 and the output 395 of the second divider 390. The frequencies of 135.4752 MHz and 196.608 MHz cannot be achieved with the integer-N PLL of FIG. 3 using $f_r=12$ MHz. However, if a fractional-N PLL is used (e.g., PLL 100 of FIG. 2), there may be some fractional spurs at the output clock signal.

Exemplary Methods of Generating a Clock Signal

The present invention further relates to methods of generating a periodic (e.g., clock) signal. The method generally comprises (1) receiving a reference clock signal; (2) determining a phase offset between the reference clock signal and a feedback clock signal; (3) generating the periodic signal in response to a control signal that changes or maintains a frequency of the periodic signal based on or corresponding to the phase offset; and (4) generating said feedback clock signal by selecting transitions from among K phases of the periodic signal in response or in accordance with a multi-bit frequency word, wherein K is an integer of at least 2.

In one exemplary embodiment, the periodic (clock) signal is generated by a voltage controlled oscillator, such as VCO 340 (FIG. 4). In various alternative or additional embodiments, the method includes receiving the K phases of the periodic signal (e.g., clock signals 343-1 through 343-K from the VCO) and the multi-bit frequency word (e.g., FREQ in FIGS. 5A and 7A) in a first flying-adder (e.g., flying-adder divider circuit 350 in FIG. 4), and the first flying-adder divides the periodic signal by (i) an integer I of at least 2, and optionally, (ii) a fraction i/N, wherein i is an integer of less than N, and I (and optionally i) are defined by the multi-bit frequency word. The divided signal output by the first flying-adder may be further divided (e.g., by divide-by-N divider 360) to generate the feedback signal (e.g., $f_b$ 365 in FIG. 4).

In various embodiments, the present method divides the K phases of the periodic signal (e.g., using divider 370, as shown in FIG. 9) by a value $N_1$, where $N_1$ is an integer of at least 2, and provides the divided K phases (e.g., signal 375 in FIG. 9) to the first flying-adder. In such a case, the divided signal output by the first flying-adder may be further divided (e.g., by divider 360 in FIG. 9) by a value $N_2$, where $N_2$ is an integer of at least 2, to generate the feedback signal (e.g., $f_b$ 365).

In further embodiments of the present method, a second periodic (e.g., clock) signal (e.g., $f_0$ 395 in FIG. 10) can be generated from the first periodic signal (e.g., clock phases 343-1' through 343-K' in FIG. 10) using a second flying-adder outside the phase locked loop (e.g., flying-adder divider 380). The method may thus further comprise (i) receiving the periodic signal in a second flying-adder, (ii) providing a second divided signal (e.g., $f_{s1}$ 385 in FIG. 10), and (iii) further dividing the second divided signal to generate the second periodic signal.

Referring to the examples in the paragraphs above, from $T_{out}=F*\Delta$, or $1/f_{out}=F*\Delta$, mathematically, substantially any frequency can be generated since F is a real number (it can have a fractional part). Thus, the fineness or granularity of the frequency resolution can be arbitrarily set or determined. In hardware implementations, as long as the designer allows for a relatively large number of bits for the fractional part, then substantially any frequency can be generated.

CONCLUSION/SUMMARY

Thus, the present invention provides circuitry and methods for clock generation using a flying-adder divider in a phase locked loop. The present circuitry and methods improve frequency resolution without decreasing bandwidth, which generally cannot be done with integer-N. The frequency resolution of the present approach is $f_r/K$ if only PDFR-compatible fractions are utilized. In contrast to fractional-N PLL, the present invention does not generate fractional spurs if the frequency resolution is constrained at $f_r/K$. The present invention further possesses the capability to generate arbitrary frequencies if the fraction used in the frequency control word is not constrained as PDFR-compatible. In various embodiments, a second flying-adder can advantageously be added to the PLL, either outside (if the first flying-adder is inside) or inside (if the first flying-adder is outside) the PLL.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A phase locked loop circuit, comprising:
a phase detector configured to (i) receive an incoming clock signal and a feedback signal, and (ii) output a phase offset signal;
a control circuit configured to receive said phase offset signal and output a control signal;
a frequency generator configured to (i) receive said control signal and (ii) output a periodic signal having a first frequency; and
a flying-adder divider circuit configured to receive said periodic signal and output said feedback signal.

2. The phase locked loop circuit of claim 1, wherein said control circuit comprises a charge pump configured to receive said phase offset signal and output an analog offset signal, and a filter configured to receive said analog offset signal and output said control signal.

3. The phase locked loop circuit of claim 1, wherein said frequency generator generates K phases of said periodic signal, K being an integer of at least 2.

4. The phase locked loop circuit of claim 1, wherein said flying-adder divider circuit receives said K phases, and uses said K phases to produce said feedback signal.

5. The phase locked loop circuit of claim 4, comprising (i) a flying adder circuit configured to receive said periodic signal and provide a first signal, and (ii) a first divide-by-N divider configured to receive said first signal and provide said feedback signal, wherein N is an integer.

6. The phase locked loop circuit of claim 5, further comprising a second divide-by-N divider configured to (i) divide said K phases by a value $N_2$, where $N_2$ is an integer of at least 2, and (ii) provide the divided K phases to said flying-adder circuit, wherein said first divide-by-N divider is configured to divide said first signal by a value $N_1$, where $N_1$, is an integer of at least 2.

7. The phase locked loop circuit of claim 5, wherein said phase locked loop has a frequency output ($f_{vco}$) of ([F*N]/K) ($f_r$), where F is a numerical value represented by a multi-bit frequency word received by said flying-adder divider circuit, and $f_r$ is a frequency of said incoming clock signal.

8. The phase locked loop circuit of claim 7, wherein said multi-bit frequency word includes a plurality of integer bits and a plurality of fraction bits.

9. The phase locked loop circuit of claim 1, further comprising a second flying-adder divider circuit, receiving said K phases of said periodic signal and providing a second signal.

10. The phase locked loop circuit of claim 8, wherein said first signal has a frequency that equals $K/F_1$ multiplied by the frequency of the first periodic signal, wherein $F_1$ is a value of a first multi-bit frequency word received by said first flying-adder divider circuit, and said second signal has a frequency that equals $K/F_2$ multiplied by the frequency of the first periodic signal, wherein $F_2$ is a value of a second multi-bit frequency word received by said second flying-adder divider circuit.

11. The phase locked loop circuit of claim 9, wherein F is an integer or an integer plus fraction of the formula I+(i/N), where I is an integer, and i is an integer less than N.

12. The phase locked loop circuit of claim 9, having a frequency resolution $f_r/K$.

13. The phase locked loop circuit of claim 1, wherein said frequency generator comprises a voltage controlled oscillator.

14. The phase locked loop circuit of claim 1, wherein said phase detector comprises a phase frequency detector.

15. A method of generating a periodic signal, comprising:
receiving a clock signal;
determining a phase offset between the clock signal and a feedback signal;
generating said periodic signal in response to a control signal that changes or maintains a frequency of said periodic signal based on or corresponding to said phase offset; and
generating said feedback signal by selecting transitions from among K phases of said periodic signal in response to or in accordance with a multi-bit frequency word, wherein K is an integer of at least 2.

16. The method of claim 15, wherein said periodic signal is generated by a voltage controlled oscillator.

17. The method of claim 15, wherein said K phases and said multi-bit frequency word are received by a first flying-adder divider circuit, and said first flying-adder divider circuit divides said periodic signal by (i) an integer I of at least 2 and (ii) a fraction i/N, wherein is an integer of less than N, and I and i are defined by said multi-bit frequency word.

18. The method of claim 17, further comprising generating a divided signal from said periodic signal with a second flying-adder divider circuit.

19. The method of claim 17, wherein said flying-adder divider circuit comprises (i) a flying adder circuit configured to receive said periodic signal and provide a divided signal, and (ii) a first divide-by-N divider configured to receive and provide said feedback signal, wherein N is an integer.

20. The method of claim 18, further comprising a second divide-by-N divider configured to (i) divide said K phases by a value $N_2$, where $N_2$ is an integer of at least 2, and (ii) provide the divided K phases to said flying-adder circuit, and said first divide-by-N divider is configured to divide said first signal by a value $N_1$, where $N_1$ is an integer of at least 2.

* * * * *